US006914543B2

(12) United States Patent
Floros et al.

(10) Patent No.: US 6,914,543 B2
(45) Date of Patent: Jul. 5, 2005

(54) METHOD FOR INITIALIZING POSITION WITH AN ENCODER

(75) Inventors: John H. Floros, Novi, MI (US); Nick Sarafopoulos, Taylor, MI (US); Paul T. Jordan, Lincoln Park, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 295 days.

(21) Appl. No.: 10/160,862

(22) Filed: Jun. 3, 2002

(65) Prior Publication Data

US 2003/0222798 A1 Dec. 4, 2003

(51) Int. Cl.$^7$ ............................................. H03M 1/22
(52) U.S. Cl. ................................ 341/2; 341/11; 341/35
(58) Field of Search ........................... 341/1, 2, 11, 13, 341/16, 17, 35, 3; 324/173, 207.13

(56) References Cited

U.S. PATENT DOCUMENTS

| 4,041,483 | A | * | 8/1977 | Groff ............................ 341/9 |
| 4,255,789 | A | | 3/1981 | Hartford et al. |
| 4,807,164 | A | | 2/1989 | Onyon |
| 5,038,243 | A | * | 8/1991 | Gordon ........................ 341/2 |
| 5,382,889 | A | | 1/1995 | Peters et al. |
| 5,457,371 | A | * | 10/1995 | Gordon ..................... 318/661 |
| 5,489,845 | A | | 2/1996 | Weber et al. |
| 5,528,930 | A | | 6/1996 | Park |
| 5,720,285 | A | | 2/1998 | Petersen |
| 5,767,767 | A | | 6/1998 | Lima et al. |
| 5,902,934 | A | | 5/1999 | Sprague et al. |
| 5,926,122 | A | | 7/1999 | Dalton |
| 5,998,783 | A | | 12/1999 | Stridsberg |
| 6,021,171 | A | | 2/2000 | Andrews |
| 6,073,713 | A | | 6/2000 | Brandenburg et al. |
| 6,084,234 | A | | 7/2000 | Stridsberg |
| 6,172,359 | B1 | | 1/2001 | Stridsberg |
| 6,191,415 | B1 | | 2/2001 | Stridsberg |
| 6,329,782 | B1 | * | 12/2001 | Chen et al. .................. 318/727 |
| 6,486,658 | B2 | * | 11/2002 | Naidu .................... 324/207.21 |
| 6,498,451 | B1 | * | 12/2002 | Boules et al. ............... 318/661 |
| 6,683,543 | B1 | * | 1/2004 | Yeo ............................. 341/13 |
| 2001/0045828 | A1 | | 11/2001 | Naidu |

FOREIGN PATENT DOCUMENTS

| WO | WO 01/20600 | 3/2001 |
| WO | WO 02/20293 | 3/2002 |

OTHER PUBLICATIONS

Search Report dated Aug. 22, 2003 for corresponding British Patent Application No. GB 0309838.1.

* cited by examiner

Primary Examiner—Michael Tokar
Assistant Examiner—Linh V. Nguyen
(74) Attorney, Agent, or Firm—Brinks Hofer Gilson & Lione

(57) ABSTRACT

A method for detecting an absolute rotational position of an electromechanical device or the at least one component thereof comprising determining a first absolute position of the electromechanical device or the at least one component thereof based on a commutation index signal, obtaining a Z-index signal, and determining a second absolute position of the electromechanical device or the at least one component thereof based on the Z-index signal. The method initially determines a coarse rotational position of the electromechanical device such as a rotor or steering wheel based on the commutation index signal. When a device's position is first initialized by a commutation index signal before the Z-index pulse is detected, the device's position is re-initialized upon detection of the Z-Index pulse to provide a more accurate absolute device rotational position.

24 Claims, 3 Drawing Sheets

METHOD FOR INITIALIZING POSITION WITH AN ENCODER

FIELD OF THE INVENTION

The invention generally relates to a method for determining the absolute rotational position of an electromechanical device. In particular, the invention relates to a method for determining the absolute position of an electromechanical device using a coarse and a fine index.

DESCRIPTION OF THE RELATED ART

Mechanical devices normally require the control of linear or rotational force, speed, and/or position. Such control may be implemented using hydraulics, pneumatics, electromechanical and mechanical devices. Examples of electromechanical devices are AC motors, DC motors, stepper motors, and actuators. DC motors are used to convert electrical energy into rotational mechanical energy. The speed of these motors may be controlled using open-loop and closed-loop control systems. In an open-loop system, the real-time, present position of the rotor is not monitored continuously.

In a typical closed-loop system, the position of the rotor is fed back into the control process periodically. Such feedback mechanisms may take many forms. Incremental shaft encoders, for example, may be used to generate pulses that represent the shaft position. Synchro/resolvers may be used to indicate dynamic rotational position in a servo system while the host computer sends signals to the servo power amplifier. The servo power amplifier in turn provides power to the rotor. The rotational position of the rotor is then fed back into the host computer, thus completing the control loop.

A position encoder system that comprises an encoder disk and at least two detector devices arranged to read at least one track on the encoder disk having low resolution to produce position signals is known. In this type of encoder system, the detector devices each provide position signals to a processing device having a substantial phase difference between them.

A position transducer having a moving modulating portion that can move to different positions through a rotation and which provides at least one analog signal that varies periodically with the moving position of the moving part is also known.

In addition, a quadrature encoder for detecting position has been used to detect the rotational position of a rotor or steering wheel. However, the quadrature encoder signal can only provide a relative position from a starting point.

BRIEF SUMMARY OF THE INVENTION

The present invention is directed to a method for detecting an absolute rotational position of a mechanical device or the components of an electromechanical device, such as a rotor or steering wheel. In the method of the invention as disclosed herein, two digital signals provide a relative position of a rotor or steering wheel from a starting point. A Z-index pulse and/or the commutation index are/is used to initialize a rotor position upon detection of the Z-index pulse and/or the commutation index.

In one embodiment, a relative rotational position of an electromechanical device or its component, such as a rotor or steering wheel, is determined from two digital signals. The absolute rotational position of the rotor or steering wheel is then detected based on a commutation index and the Z-index pulse. When a rotor position is first initialized by a commutation index signal before the Z-index pulse is detected, the rotor position is re-initialized upon detection of the Z-index pulse. The Z-index is used or detected once every rotation to determine a more accurate absolute position. Typically, the commutation index signal of the invention occurs after each rotational motion of between about 15–90 electrical degrees, preferably about 60 electrical degrees, thus providing a coarse index for absolute position detection.

The method of the invention provides both speed and accuracy when determining the absolute position of electromechanical devices or one or more components thereof, such as a rotor or steering wheel. In addition, the method of the invention provides a low cost alternative to methods that rely on the use of expensive absolute encoders to determine the absolute position of a device such as a rotor.

DETAILED DESCRIPTION OF THE PREFERRED EMBODIMENTS OF THE INVENTION

The present invention provides a method for detecting an absolute rotational position of an electromechanical device or a component of an electromechanical device, e.g., a rotor or steering wheel, comprising generating two digital signals corresponding to a relative position of the rotor or steering wheel from a starting point, generating a commutation index signal, generating a Z-index pulse, and initializing a rotor position upon detection of the Z-index pulse and/or commutation index signal.

A Z-index pulse or signal may be generated in various ways especially those known in the art. For example, an optical encoder uses a beam of light and a beam-interrupting slotted disk to produce electrical pulses in response to a rotation. The electrical pulse corresponding to the Z-index pulse, which signals the detection of the zero reference point of, say, a rotor, may be generated by designing the slotted disk such that the slot corresponding to the rotor's zero point would interrupt the beam differently from all the rest of the slots and thus produce a unique electrical pulse corresponding to the Z-index pulse. The same principle applies to the generation of commutation index signals. However, in a preferred embodiment of the invention, the commutation index signals occur more frequently than the Z-index signal which occurs only once per rotor rotation. Thus, for example, in a preferred embodiment of the invention, the commutation index occurs at about every 60° subdivisions of the rotor.

Figure 1:
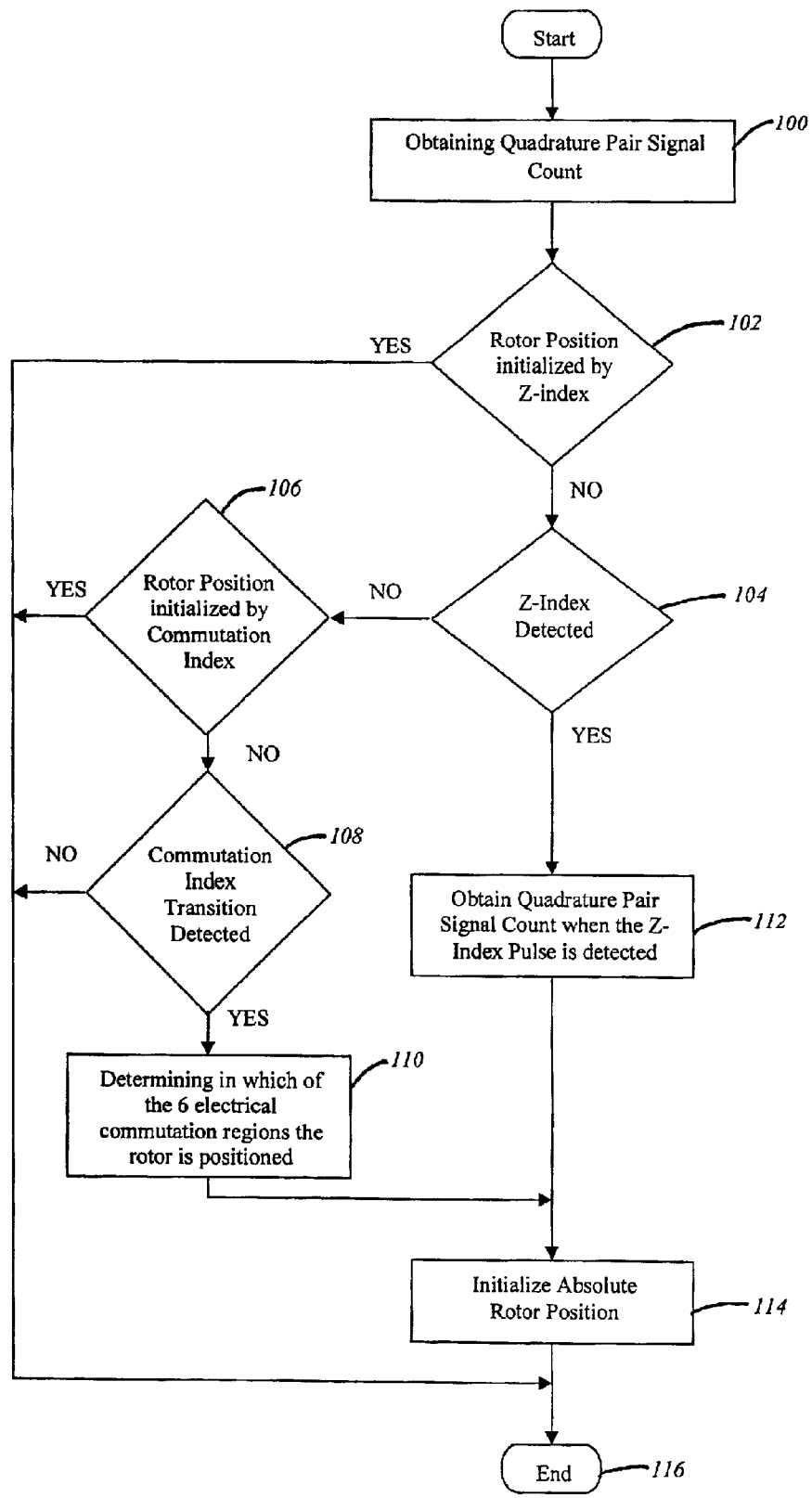
FIG. 1 shows a flow chart that illustrates an embodiment of the invention wherein a commutation index signal and a Z-index signal are used to determine the absolute rotational position of a device.

FIG. 1 depicts a preferred embodiment of the invention. In this embodiment, the method initially obtains two digital signals, the quadrature pair 100. After obtaining the quadrature pair, the method determines if the rotor position has been initialized by the Z-index 102. If so, the method terminates 116. Otherwise, the method determines if the Z-index has been detected 104. If so, the method obtains the quadrature pair signal count 112 and then initializes the absolute rotor position 114 after which the method terminates 116. If no Z-index signal has been detected in step 104, the method determines if the rotor position has been initialized by the commutation index 106. If so, the method ends 116. Otherwise, the method determines if a commutation index transition has been detected 108. If no transition has been detected, the end of the process is reached. If a commutation index transition has been detected, the method determines in which of the six electrical commutation regions, i.e., the 60°-subdivisions of the rotor corresponding to the 0°–60°, 60°–120°, 120°–180°, etc., the rotor is positioned 110. The method then initializes the absolute rotor position 114 and the method ends 116.

Preferably, the commutation index signal occurs after each rotational motion of between about 15–90 electrical degrees, preferably 60 electrical degrees. In this preferred embodiment, reinitialization of the rotor position is prevented after the Z-index pulse has initialized the rotor position for each rotor or steering wheel revolution. The invention may be used in various applications such as robotics, equipment positioning, instrumentation, fuel pump flow metering, or menu selector knobs.

The index signals are preferably obtained using at least one encoder disk that constitutes an encoder system. As is well-known in the art, a typical encoder disk comprises an ordered array of lines or bar marks around its circumference each of which corresponds to a count or step.

An encoder refers to a feedback device that converts mechanical motion into electrical signals, i.e., a mechanical motion sensor. In one embodiment, the encoder is a rotary encoder, which produces digital pulses corresponding to incremental angular motion. Thus, for example, a 1000-line encoder produces 1000 pulses for each mechanical revolution.

Preferred rotary encoders of the invention are made of a thin metal disk, preferably with cut slots, and more preferably with about 1024 cut slots although a disk with other number of cut slots may be used. The rotary encoders of the invention are preferably made of glass, plastic, metal, or combination of materials. In a preferred embodiment, the encoder comprises a photographically deposited radial pattern organized in tracks. This type of encoders produce digital pulses when, for example, radial lines in each track interrupt a light beam between a photoemitter-detector pair.

In a preferred embodiment, a rotary encoder is an incremental encoder that produces digital pulses as the shaft rotates, allowing measurement of relative position of the shaft. The incremental encoder, sometimes called a relative encoder, is simpler in design than the absolute encoder.

A typical incremental encoder consists of two tracks and two sensors that have two outputs, channels A and B, that are referred to as the quadrature pair. These two signals are said to be in quadrature because the repeating on-off pattern of one signal is offset by one-quarter of a pulse cycle relative to the other. If one full on-off cycle of an output is considered to be equal to 360 electrical degrees, then the two signals would ideally be 90 degrees offset from each other.

Each complete cycle of the quadrature pair contains four transition edges. The magnitude of the position parameter is determined by counting all transition edges in the quadrature pair. By comparing the transitions to a time base, velocity can be determined.

As the shaft rotates, pulse trains occur on the channels at a frequency proportional to the shaft speed, and the phase relationship between the signals yields the rotation direction. By counting the number of pulses and knowing the resolution of the disk, the angular motion can be measured.

The quadrature pair, i.e., the A and B channels, can be used to determine the direction of rotation by determining which channel leads the other. One signal is arbitrarily selected as the primary signal and the other is designated as the secondary signal. If the phase of the primary signal leads the secondary signal phase, the sign of change is positive. If the secondary signal leads the primary signal, the sign of the change is negative. Combining these techniques, a quadrature signal pair can provide all the necessary position information on a single axis.

In a preferred embodiment of the invention, a quadrature incremental encoder signal, preferably digital, is used to determine the direction of, for example, a rotor or steering wheel rotation. In a preferred embodiment, the phase difference, defined as the phase of signal A minus the phase of signal B, is +90° when a device such as a rotor or a vehicle steering system is turning right or clockwise, and −90° when the rotor or vehicle steering system is turning left or counterclockwise. The quadrature signals A and B may be decoded using, for example, sequential logic circuits and the direction of rotation determined based on the level of one signal during an edge transition of the second signal.

In another preferred embodiment, the encoder may be a magnetic encoder. A magnetic encoder comprises a rotating gear made of ferrous material and a magnetic system that has a permanent magnet and a magnetoresistive sensor. One type of magnetoresistive sensor relies on the Hall effect to generate a pulse for every gear tooth that passes the sensor. Another type uses a simple coil of wire in the magnetic field wherein a voltage pulse is induced in the sensing coil as the gear teeth pass by the sensor and disturb the flux. A preferred embodiment of the invention may use either type of magnetic encoder system.

In a magnetic encoder system, the gear is typically mounted on a rotating shaft and has precisely machined teeth that are magnetically coded to provide a code pattern. The magnetic code pattern is interpreted by the sensor as a series of on and off states. As the disk rotates, the gear teeth disturb the magnetic flux emitted by the permanent magnet, which causes the flux field to expand and collapse. These changes in the magnetic field are detected by the sensor, which then produces a corresponding digital or pulse signal output that represents incremental rotary motion. A magnetic encoder provides good resolution and can operate under a variety of conditions.

In another preferred embodiment, the encoder may be a digital optical encoder. A digital optical encoder is a device that converts motion into a sequence of digital pulses. Specifically, an optical encoder uses a beam of light and a beam-interrupting slotted disk to produce electrical pulses in response to a rotation. By counting a single bit or by decoding a set of bits, the pulses can be converted to relative or absolute position measurements. One advantage of optical encoders is that the shaft position is detected using a light beam. Thus, because the structure does not include contacting moving parts, optical encoders have a relatively long rotational life, e.g., more than 10 million cycles.

In a preferred embodiment, the method comprises using a frequency digital counter, a detector for receiving position signals, and a processor for determining the encoder disk motion based on signals from the detector. In another embodiment, the method may also comprise using an optical system that produces light such as a light emitting device, or optionally, an analog-to-digital converter for sampling and digitizing analog encoder signals.

In one embodiment, the method of the invention comprises using digital filters for removing the effects arising from electrical noise on encoder signals, an element comprising, for example, a capture latch for recording the current rotor position based on an external signal, and an element for comparing a current rotor position with a preselected value and which produces a signal when the preselected value is reached.

A preferred embodiment of the invention may also comprise using a feedback device that converts angular shaft position into analog signals. The analog signals may be processed using means such as a resolver-to-digital converter to produce digital position information. The resolver may be a transmitter or a receiver type.

In conjunction with the commutation index signal, a preferred embodiment uses a means for generating a Z-index pulse to provide a highly accurate means for absolute position detection. The Z-index pulse of the invention allows determination of the absolute position once a rotation. Essentially, the Z-Index pulse interrupt routine will have the final say on initializing rotor position since it is more precise than the commutation index.

Commutation index signals can provide absolute position between about 15–90 electrical degrees, more particularly every 60 electrical degrees, thus allowing absolute position detection sooner than with the Z-Index pulse. However, the commutation index signals are not as accurate as the Z-index pulse. Together, the commutation index signal and the Z-index signal provide both speed and accuracy when determining the absolute position of, for example, a rotor or steering wheel.

Thus, the various embodiments of the invention take advantage of both commutation index and Z-index signals to obtain absolute position information as soon and as accurate as possible at a relatively low cost. If the Z-index pulse is encountered first, absolute position is found and no further initialization is needed. Thus, in a preferred embodiment of the invention, once the rotor position has been initialized by the Z-Index pulse interrupt routine, it cannot be re-initialized again. If a rotor position was first initialized by the commutation index, the Z-Index will re-initialize the position when a Z-Index pulse is encountered to obtain a more accurate rotor position.

Figure 2:
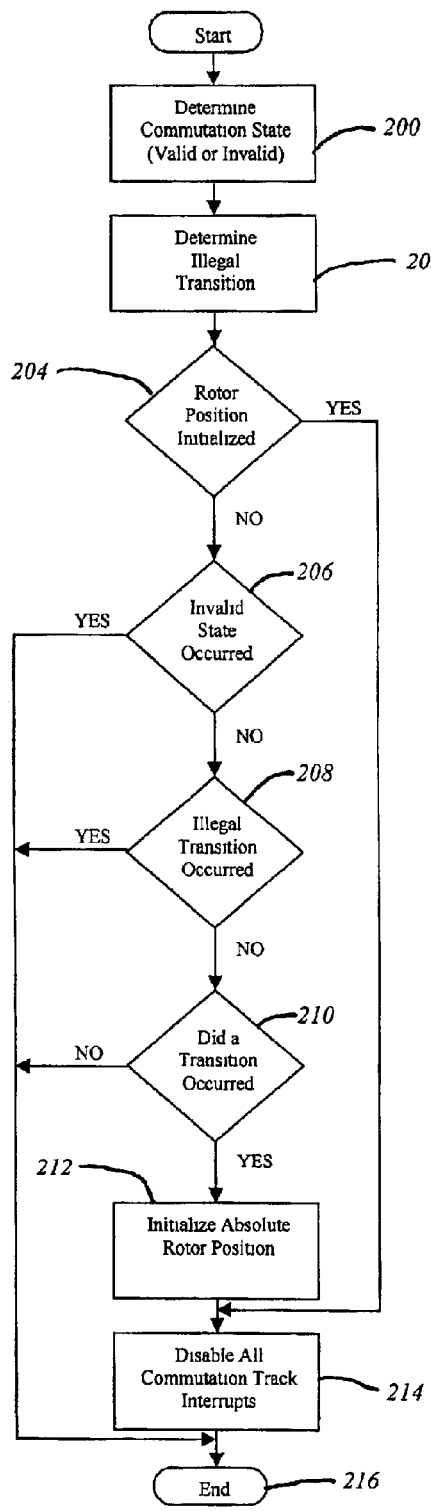
FIG. 2 shows a flow chart illustrating an embodiment for initializing an absolute rotor position using the commutation index interrupt routine.

FIG. 2 shows a flow chart for initializing a rotor position using the commutation index interrupt routine. The program first determines whether a commutation state is valid or invalid 200 and then determines if an illegal transition has occurred 202. The program then determines if the rotor position has been initialized 204. If so, then the routine disables all commutation index or commutation track interrupts 214 and ends the program. If the rotor position has not been initialized, the program determines if an invalid state has occurred 206 and if so, the program ends 216. If no invalid state has occurred, the program then determines if an illegal commutation index transition has occurred 208. If so the program terminates 216. If no illegal transition has occurred, the program determines if a commutation index transition has occurred 210. If no transition has occurred, the program ends. If a transition has occurred, the routine initializes the absolute rotor position 212. The routine then disables all commutation index interrupts and ends the program 216.

Figure 3:
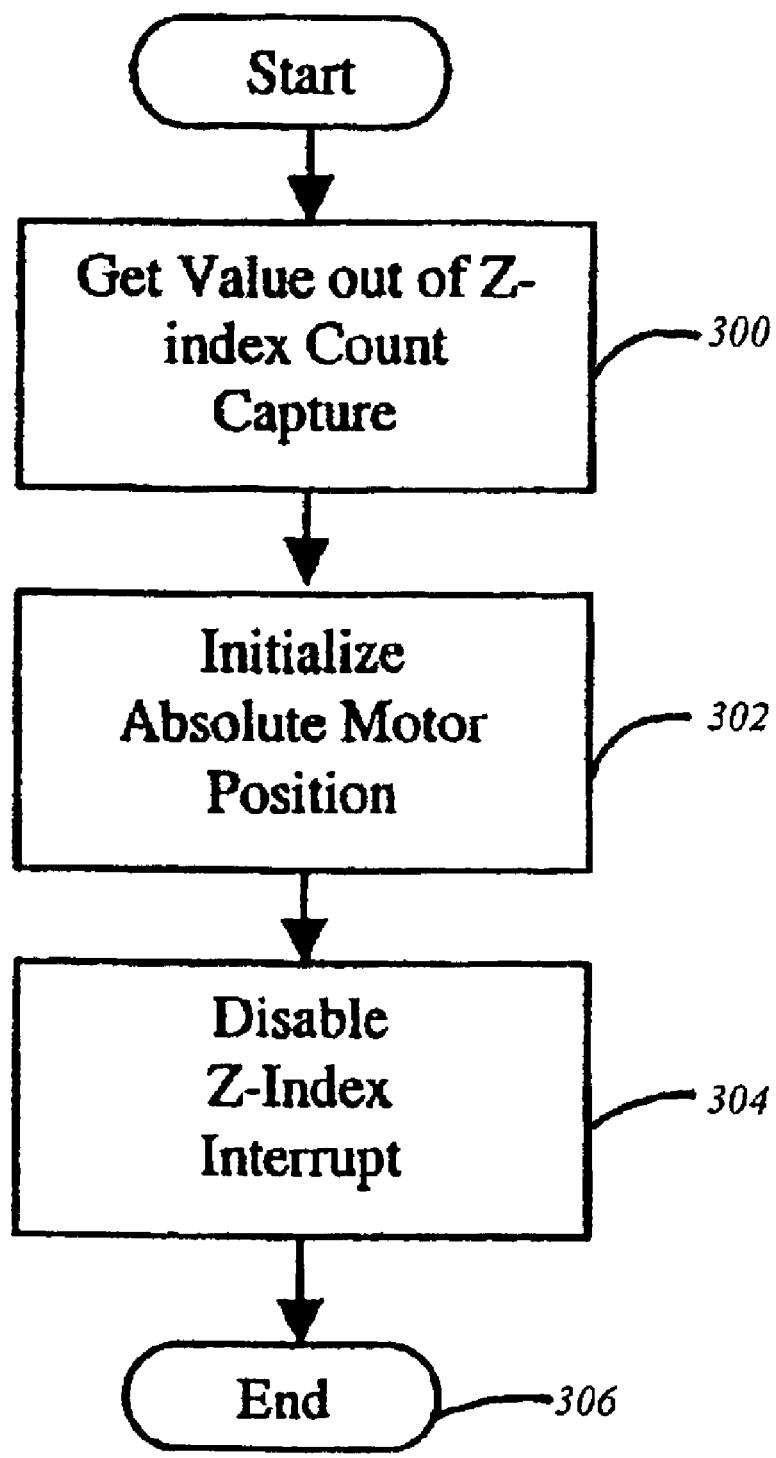
FIG. 3 illustrates a flow chart illustrating an embodiment for initializing an absolute rotor position using a Z-index pulse interrupt routine.

FIG. 3 illustrates a flow chart for initializing absolute rotor position using a Z-index pulse interrupt routine. The routine first obtains the value out of the Z-index count capture 300. The routine then initializes the absolute rotor position 302 and disables the Z-index interrupt 304 after which the routine terminates 306.

EXAMPLE

Two signals A and B are presented to the microcontroller and inverted with respect to the signals on the module connector. Together, these two signals form a digital quadrature incremental encoder signal. The two signals are used to determine differential position and direction of the rotor or steering wheel. The up/down counter timer peripheral in the microcontroller is used to decode the quadrature inputs and convert them to an increasing count (turn to the right) or decreasing count (turn to the left). This count which corresponds to the rotor or steering wheel position can be read directly from the register. Since the rising and falling edges for both signals A and B are counted, there are four counts per encoder line.

In a preferred embodiment of the quadrature encoder, a rotor position encoder is coupled with a rotor position sensor interface. A corresponding signal typically has a frequency of 0–50 khz and a resolution of 0.09 rotor degrees for each count. A typical hardware response time is about 3 $\mu$s.

The commutation index signal is obtained from three index signals $I_A$, $I_B$, and $I_C$ which are presented to the microcontroller and inverted with respect to the signals on the module connector. The combination of the three index signals specifies the rotor position within about 60 electrical degrees. For example, the rotor position may be divided into six regions corresponding to 0°–60°, 60°–120°, 120°–180°, and so on. The three index signals may be used as interrupts, specifically at startup, or as polled signals, specifically while running for error detection. When presented to the microcontroller, the three index signals are inverted with respect to the signals on the module connector. Preferably, software filtering is used particularly when the filtering circuit passes frequencies above 100 Hz.

In a preferred embodiment of the commutation index encoder, a rotor position sensor is coupled with a peripheral device such as a rotor position sensor interface. A typical signal has a wave frequency of about between 0–100 Hz and a resolution of between about 15–90 electrical degrees after decoding, preferably about 60 electrical degrees. A typical hardware response time is about 2.5 $\mu$s.

Finally, the Z-index signal indicates when the rotor position sensor encoder has rotated to its home position which is reached once every mechanical rotor rotation. The signal at the microcontroller is inverted with respect to the signal at the connector.

What is claimed is:

1. A method for detecting an absolute rotational position of an electromechanical device or at least one component thereof comprising:

using a pair of signals to determine a relative position of the electromechanical device or the at least one component thereof from a starting point;

obtaining a commutation index signal;

determining a first absolute position of the electromechanical device or the at least one component thereof based on the commutation index signal;

obtaining a Z-index signal, wherein the position of the electromechanical device or the at least one component thereof is re-initialized when the Z-Index signal is detected, and the position the electromechanical device or the at least one component thereof is initialized by a commutation index signal before the Z-index signal is detected; and determining a second absolute position of the electromechanical device or the at least one component thereof based on the Z-index signal.

2. The method of claim 1, wherein a coarse absolute rotational position of a rotor or steering wheel is determined based on the commutation index signal.

3. The method of claim 2 further comprising determining the absolute rotational position of the rotor or steering wheel based on the Z-index signal.

4. The method of claim 2, wherein the coarse rotational position of the electromechanical device or the at least one component thereof is determined every 15–90 electrical degrees.

5. The method of claim 2, wherein the coarse rotational position of the electromechanical device or the at least one component thereof is determined about every 60 electrical degrees.

6. The method of claim 1, wherein the commutation index signal occurs after each rotational motion by the electromechanical device or the at least one component thereof of between about 15–90 electrical degrees.

7. The method of claim 1, wherein the commutation index signal occurs after each rotational motion by the electromechanical device or the at least one component thereof of about 60 electrical degrees.

8. The method of claim 1, wherein the commutation index or Z-index signal is obtained using at least one encoder.

9. The method of claim 8, wherein the encoder is a rotary, or an optical encoder.

10. The method of claim 1, wherein the pair of signals constitute a quadrature encoder signal.

11. The method of claim 1 comprising using an encoder to obtain the signals corresponding to a relative position of the electromechanical device or the at least one component thereof.

12. The method of claim 1, wherein a phase difference of +90° between the pair of signals corresponds to a clockwise rotation of the electromechanical device or the at least one component thereof, and a phase difference of −90° corresponds to a counterclockwise rotation.

13. A method for detecting an absolute rotational position of an electromechanical device or at least one component thereof comprising:

using a pair of signals to determine a relative position of the electromechanical device or the at least one component thereof from a starting point;

obtaining a commutation index signal;

determining a first absolute position of the electromechanical device or the at least one component thereof based on the commutation index signal;

obtaining a Z-index signal, wherein a reinitialization of the position of the electromechanical device or the at least one component thereof is prevented after the Z-index signal has initialized the position of the electromechanical device or the at least one component thereof for each revolution of the electromechanical device or the at least one component thereof; and determining a second absolute position of the electromechanical device or the at least one component thereof based on the Z-index signal.

14. The method of claim 13, wherein a coarse absolute rotational position of a rotor or steering wheel is determined based on the commutation index signal.

15. The method of claim 14 further comprising determining the absolute rotational position of the rotor or steering wheel based on the Z-index signal.

16. The method of claim 14, wherein the coarse rotational position of the electromechanical device or the at least one component thereof is determined every 15–90 electrical degrees.

17. The method of claim 14, wherein the coarse rotational position of the electromechanical device or the at least one component thereof is determined about every 60 electrical degrees.

18. The method of claim 13, wherein the commutation index signal occurs after each rotational motion by the electromechanical device or the at least one component thereof of between about 15–90 electrical degrees.

19. The method of claim 13, wherein the commutation index signal occurs after each rotational motion by the electromechanical device or the at least one component thereof of about 60 electrical degrees.

20. The method of claim 13, wherein the commutation index or Z-index signal is obtained using at least one encoder.

21. The method of claim 20, wherein the encoder is a rotary, or an optical encoder.

22. The method of claim 13, wherein the pair of signals constitute a quadrature encoder signal.

23. The method of claim 13 comprising using an encoder to obtain the signals corresponding to a relative position of the electromechanical device or the at least one component thereof.

24. The method of claim 13, wherein a phase difference of +90° between the pair of signals corresponds to a clockwise rotation of the electromechanical device or the at least one component thereof, and a phase difference of −90° corresponds to a counterclockwise rotation.

* * * * *

UNITED STATES PATENT AND TRADEMARK OFFICE
CERTIFICATE OF CORRECTION

| | |
|---|---|
| PATENT NO. | : 6,914,543 B2 |
| APPLICATION NO. | : 10/160862 |
| DATED | : July 5, 2005 |
| INVENTOR(S) | : John H. Floros et al. |

It is certified that error appears in the above-identified patent and that said Letters Patent is hereby corrected as shown below:

On the Title Page, Item (56),

Column 1, line 10 under "U.S. PATENT DOCUMENTS" after "5,720,285 A 2/1998" delete "Petersen" and substitute --Peterson-- in its place.

Column 2, line 14 under "ABSTRACT" delete "Z-Index" and substitute --Z-index-- with a lowercase "i" in its place.

In The Claims

Column 6, in Claim 1, line 14 delete "Z-Index" and substitute --Z-index-- with a lowercase --i-- in its place.

Signed and Sealed this

Fifteenth Day of May, 2007

JON W. DUDAS
*Director of the United States Patent and Trademark Office*